United States Patent [19]
Shintaku

[11] Patent Number: 6,091,097
[45] Date of Patent: Jul. 18, 2000

[54] SEMICONDUCTOR DEVICE AND A METHOD OF MANUFACTURING THE SAME

[75] Inventor: Hideomi Shintaku, Tokyo, Japan

[73] Assignee: NEC Corporation, Tokyo, Japan

[21] Appl. No.: 09/233,963

[22] Filed: Jan. 20, 1999

[30] Foreign Application Priority Data

Jan. 21, 1998 [JP] Japan .................................. 10-009706

[51] Int. Cl.[7] .............................................. H01L 27/108
[52] U.S. Cl. .......................... 257/306; 257/296; 257/300; 257/306
[58] Field of Search .................... 257/300, 306, 257/296

[56] References Cited

U.S. PATENT DOCUMENTS

| | | | |
|---|---|---|---|
| 5,281,555 | 1/1994 | Cho ......................................... | 437/195 |
| 5,300,814 | 4/1994 | Matsumoto et al. ..................... | 257/758 |
| 5,300,816 | 4/1994 | Lee et al. ................................ | 257/797 |
| 5,689,126 | 11/1997 | Takaishi .................................. | 257/306 |
| 5,777,358 | 7/1998 | Yamima .................................. | 257/306 |
| 5,895,963 | 4/1999 | Yamazaki ................................ | 257/529 |
| 5,913,150 | 6/1999 | Takaishi .................................. | 438/782 |
| 5,943,591 | 8/1999 | Vokoun et al. ......................... | 438/462 |

*Primary Examiner*—David Hardy
*Assistant Examiner*—Edgardo Ortiz
*Attorney, Agent, or Firm*—Sughrue, Mion, Zinn, Macpeak & Seas, PLLC

[57] ABSTRACT

In a semiconductor device, a contact region is formed with polycrystalline silicon or the like to be connected to a drain fabricated at a predetermined position of a semiconductor substrate. A bit line is formed with polycrystalline silicon or the like to be coupled with a contact region and then a dummy wiring is simultaneously fabricated at a predetermined position in a peripheral region of the substrate. Thanks to the provision, a film formed through a coating process has a uniform thickness.

4 Claims, 6 Drawing Sheets

SEMICONDUCTOR DEVICE AND A METHOD OF MANUFACTURING THE SAME

BACKGROUND OF THE INVENTION

The present invention relates to a semiconductor device having a multi-layer wiring structure and a method of manufacturing the same.

DESCRIPTION OF THE PRIOR ART

The multi-layer wiring structure is used, for example, in a dynamic random-access memory (DRAM). As can be seen from FIG. 1A, the DRAM includes a semiconductor substrate 311. On the substrate, there are primarily arranged a peripheral region 301 in which a cut-off area is formed for separation of chips, a peripheral circuit region 302 in which a peripheral circuit and the like are fabricated, and a memory cell region 303 in which a memory cell is formed.

Figure 1A:
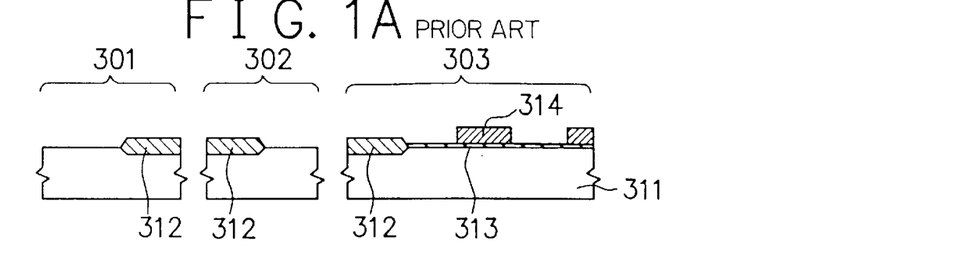
FIGS. 1A to 1K are schematic diagrams for explaining a manufacturing method of a conventional semiconductor device, for example, a DRAM.

These constituent regions are manufactured as follows. In the memory cell region 303, there is fabricated, in an area defined by a device separation region 312 on the substrate 311, a gate electrode 314 on a gate insulation film 313. In this connection, although not shown, after the gate electrode 314 is formed, there is conducted, for example, an ion injection process by using the electrode 314 as a mask to thereby produce an impurity region to be used as source and drain regions.

Figure 1B:
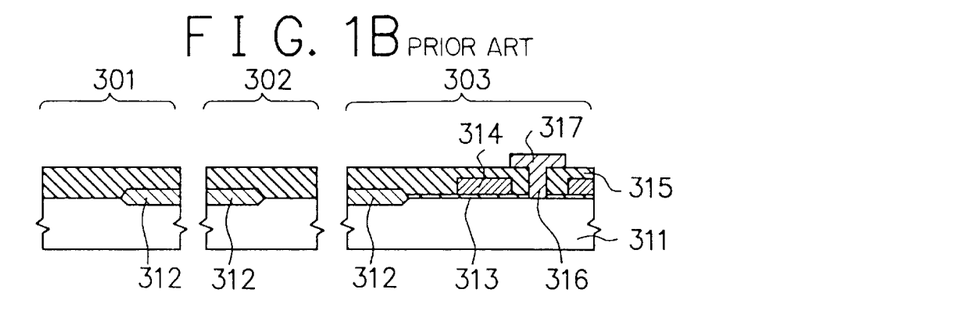

Thereafter, as shown in FIG. 1B, a inter-layer film 315 is formed with an insulating substance in an overall region of the substrate 311 and then there is fabricated a contact region 316, which is to be connected to a drain region formed at a predetermined position of the substrate 311. Thereafter, a bit line 317 is fabricated to be connected to the contact region 316.

Figure 1C:
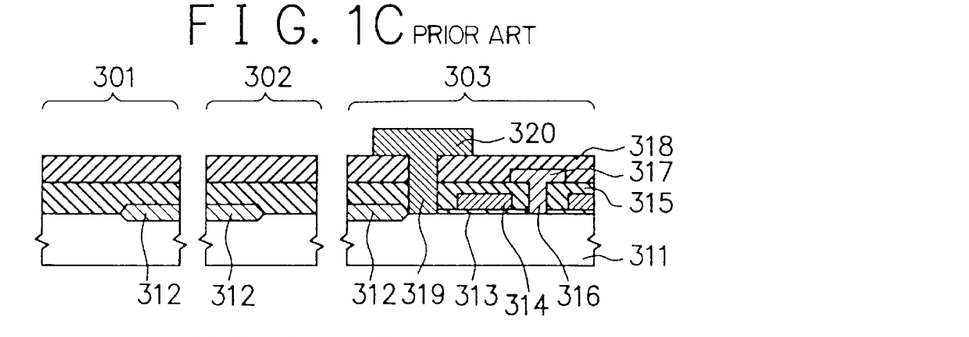

Next, an inter-layer film 318 is formed with an insulating material on the inter-layer film 315 including the bit line 317 as shown in FIG. 1C. Thereafter, there is manufactured a contact region 319, which is to be coupled with a source region formed at a predetermined position of the substrate. A capacitive electrode 320 is manufactured to be linked with the contact region 319.

Subsequently, as can be seen from FIG. 1D, a capacitive insulating film 321 is fabricated to cover the electrode 320 and then a cell plate 322 is formed thereon. As a result, there is manufactured a basic structure of a memory cell which includes a transistor including the gate plate 314, and a capacitor including the capacitive electrode 320 connected to the transistor, the capacitive insulating film 321, and a cell plate 322.

Figure 1D:
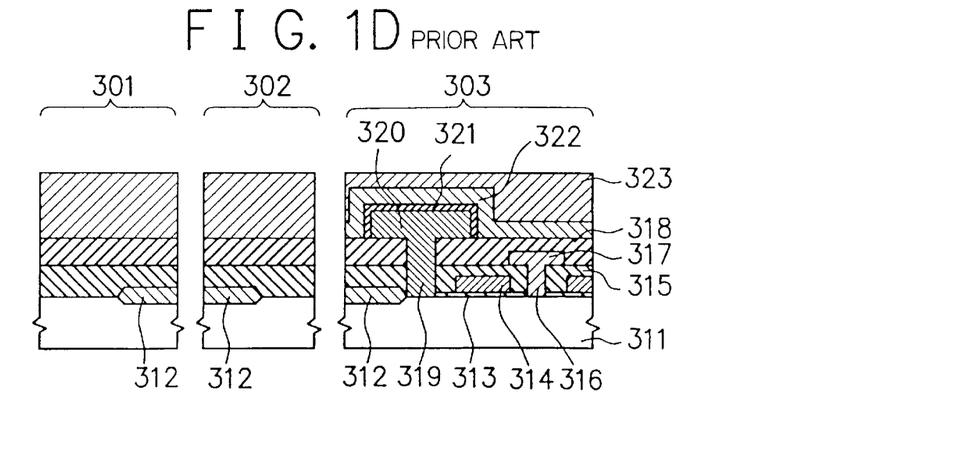

Moreover, an inter-layer film 323 is fabricated with an insulating substance on the film 318 including the cell plate 322 as shown in FIG. 1D. Formed on the film 323 is a wiring layer to be connected to the bit line 317 and the cell plate 322 described above.

Figure 1E:
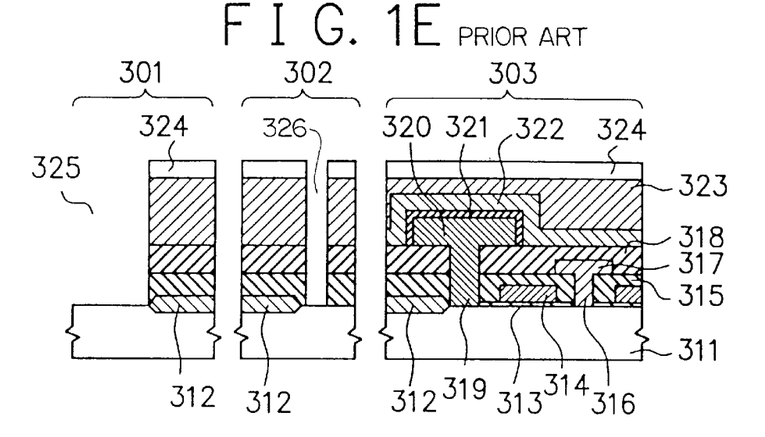

Next, there is formed a resist pattern 324 by known photolithography as shown in FIG. 1E. The pattern 324 includes holes for the cut-off regions in the peripheral region 301 and holes for through-hole forming regions in the peripheral circuit region 302, the through-holes being used to establish connection to the substrate. By achieving an etching process with the resist pattern 324 as an etching mask, there are fabricated the cut-off regions 325 and contact holes 326.

In this situation, when a scribing process is carried out with a laser or a diamond cutter with the inter-layer films and the wiring layer remaining in the cut-off region 325, stress is applied to the peripheral circuit region 302 in the scribing process, which leads to deterioration in reliability of the semiconductor device. To cope with the difficulty, a recessed portion is required to be formed in the cut-off region 325 such that the substrate 311 is exposed before the scribing process as described above.

Incidentally, although not shown, there are simultaneously formed through-holes to establish connection to the bit line 317 and the cell plate 322.

Figure 1F:
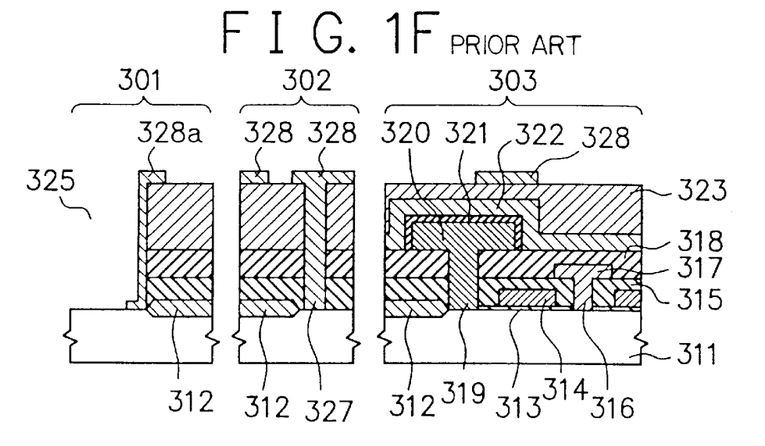

Subsequently, as can be seen in FIG. 1F, a tungsten wiring 328 is fabricated after a contact region 327. In this situation, a protective film 328a is formed with tungsten to coat surfaces exposed due to the fabrication of the cut-off region 325.

Figure 1G:
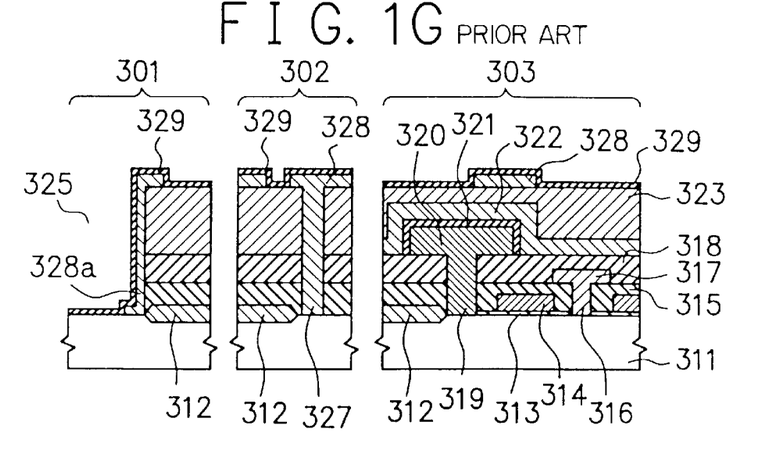
Figure 1H:
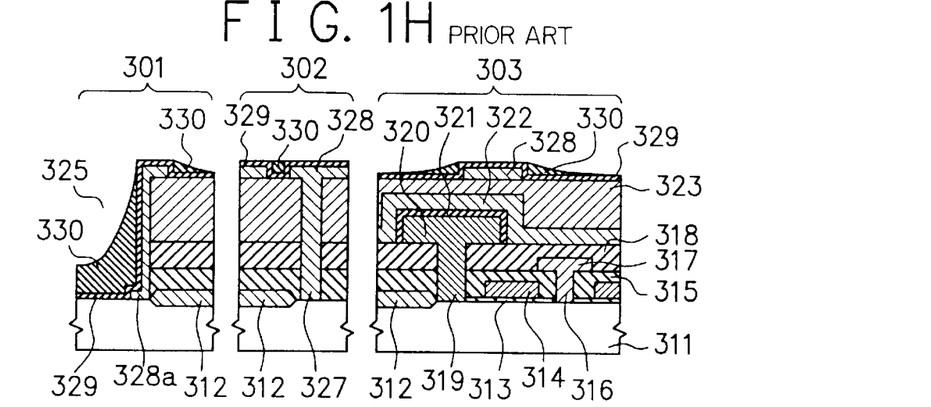

Furthermore, there is fabricated on the inter-layer film 323 including the wiring 328 an insulating film 329 with silicon nitride, plasma oxide, or the like as shown in FIG. 1G. Formed thereon is a coating film of an organic silica or the like. After firing the film, an etch-back process is conducted thereon to produce a smoothed insulating film 330 as shown in FIG. 1H. After the fabrication of metal wirings with aluminum and tungsten, a high-temperature process cannot be carried out because of fears that the aluminum wiring maybe melted down and/or a reaction might occur between the tungsten and silicon. Consequently, as the inter-layer film fabricated on the wirings of aluminum and tungsten, it is necessarily formed as a smoothed film with an organic silica for which a high-temperature process is not required.

Figure 1I:
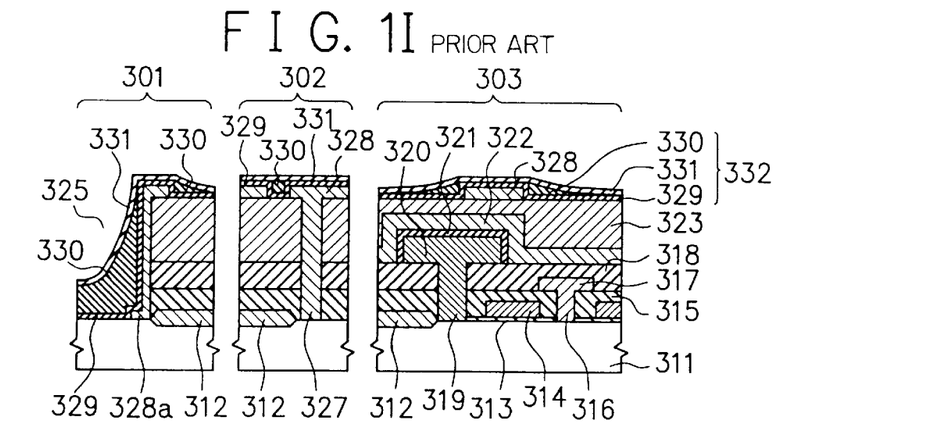

Subsequently, as can be seen from FIG. 1I, an insulating film 331 is manufactured with silicon oxide on the film 330 so as to form an inter-layer film 332 including the insulating film 329, the smoothed insulating film 330, and the insulating film 331.

Figure 1J:
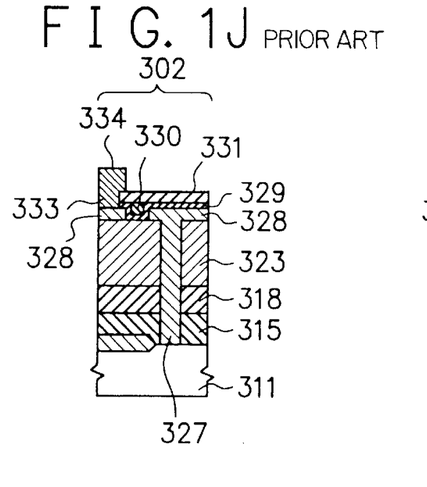

Thereafter, there is fabricated, for example, a contact region 333 in the peripheral circuit region 302 to be connected to the tungsten wiring 328, and an upper-layer electrode 334 is fabricated to be connected thereto as shown in FIG. 1J.

However, since the cut-off region 325 has a large step of about two micrometers (2²), the film of organic silica becomes nonuniform in the fabrication of the smoothed insulating film 330, and hence the film thickness varies between positions of the film 330.

In an ordinary process, the organic silica liquid is dropped onto a rotating wafer as the semiconductor substrate to thereby produce a uniform silica coating by centrifugal force. The silica flows into the cut-off region 325 formed as a deep groove and then flows out therefrom toward the periphery of the wafer by centrifugal force. The silica liquid partially flows out at a position, which varies between the cut-off regions, namely, from a recess at an edge of the cut-off region and a position where the centrifugal force is stronger than surface tension of the silica liquid. The liquid flow forms a locus on the device fabricating region including the peripheral circuit region 302 and the memory cell region 303. Namely, there is fabricated a linear narrow region from a center of the wafer to its periphery, the projected region being higher or thicker than the other region.

Although the partially thick region is smoothed to some extent through an etch-back process using hydrocarbon gas plasma or the like, the projected region cannot be completely removed. To improve flatness, if the etch-back process is excessively carried out, the organic silica in the recessed region is also removed, which leads to a disadvantage in subsequent processes. Namely, in a process to fabricate upper-layer metal wiring with aluminum or the like, the metal wiring is fixed into the recessed region. The metal wiring cannot be easily removed and hence there may occur a short circuit between upper-layer metal wiring regions. Moreover, when the etch-back process is further accomplished, the insulating film 329 is also removed to expose the tungsten wiring 328. This leads to establishing a connection between the metal wiring and the tungsten wiring 328.

Figure 1K:
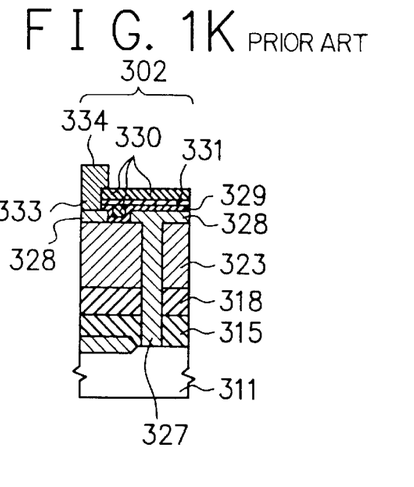

Conversely, when the etch-back process is insufficient, the smoothed insulating film 330, which is inherently formed to fill in the recessed region, includes a portion fabricated on the projected portion as shown in FIG. 1K. In consequence, the through-hole formed in the inter-layer film 332 for the fabrication of the contact region 333 is required to be formed to a deeper point in the area in which the coating thickness is nonuniform.

Furthermore, a poisonous gas is possibly generated from the organic silica in some cases. When the silica layer 330 is exposed onto a side of the region in which the contact region 333 is formed as shown in FIG. 1K, the poisonous gas reacts with the upper-layer aluminum electrode 334 to increase the contact resistance. This leads to a problem of a failure in connection.

SUMMARY OF THE INVENTION

It is therefore an object of the present invention, which has been devised to remove the problem above, to prevent occurrence of the nonuniform film produced through a liquid coating process.

In accordance with the present invention, there is provided a semiconductor device, including a transistor, further including a source and a drain formed in a chip forming region of a semiconductor substrate and a gate electrode formed on the substrate with a gate insulation film therebetween, a first inter-layer film formed on the substrate, the film covering the transistor, an electrode wiring fabricated on the first inter-layer film, a second inter-layer film formed on the electrode wiring, an upper electrode wiring layer formed on the second inter-layer film, the wiring layer establishing connection to the electrode wiring, a cut-off line region formed in an outer-most periphery of the chip forming region with a surface of the substrate being kept exposed, and a dummy wiring formed on an edge portion of the cut-off line region of the first inter-layer film, the dummy wiring being formed in a layer in which the electrode wiring is fabricated. In the configuration, an edge portion of the cut-off line region of the second inter-layer film being formed inside the cut-off line region of the dummy wiring.

As a result, the chip cut-off line region has an edge cross section including a step formed by the dummy wiring.

Furthermore, in accordance with the present invention, there is provided a semiconductor device, including a transistor, further including a source and a drain formed in a chip forming region of a semiconductor substrate and a gate electrode formed on the substrate with a gate insulation film therebetween, a first inter-layer film formed on the substrate, the film covering the transistor; a first electrode wiring fabricated on the first inter-layer film, a second inter-layer film formed on the first electrode wiring, a second electrode wiring fabricated on the second inter-layer film, a third inter-layer film formed on the second electrode wiring, an upper electrode wiring layer formed on the third inter-layer film, the wiring layer establishing connection to the second electrode wiring; a cut-off line region formed in an outer-most periphery of the chip forming region with a surface of the substrate being kept exposed, and a first dummy wiring formed on an edge portion of the cut-off line region of the first inter-layer film, the first dummy wiring being formed in a layer in which the first electrode wiring is fabricated; and a second dummy wiring formed on an edge portion of the cut-off line region of the second inter-layer film, the second dummy wiring being formed in a layer in which the second electrode wiring is fabricated. In this structure, an edge portion of the cut-off line region of the second inter-layer film is formed inside the cut-off line region of the first dummy wiring and an edge portion of the cut-off line region of the third inter-layer film is formed inside the cut-off line region of the second dummy wiring.

Resultantly, the chip cut-off line region has an edge cross section including steps respectively formed by the first and second dummy wirings.

In addition, there is provided a semiconductor device manufacturing method in accordance with the present invention, including a first step of fabricating a transistor including a source and a drain in a chip forming region of a semiconductor substrate and a gate electrode on the substrate with a gate insulation film therebetween, a second step of forming a first inter-layer film on the substrate, the film covering the transistor; a third step of fabricating an electrode wiring on the first inter-layer film and forming a dummy wiring on the first inter-layer film of an outer-most periphery of the cut-off line region, the dummy wiring being formed in a layer in which the electrode wiring is fabricated; a fourth step of forming a second inter-layer film on the electrode wiring, a fifth step of forming an etching mask on the second inter-layer film, the mask being over the dummy wiring, an edge portion thereon on an outside of the chip forming region being inside an outer edge portion of the chip forming region of the dummy wiring; a sixth step of etching the first and second inter-layer films using an etching mask and the dummy wiring is not easily etched and thereby forming a cut-off line region in an outer periphery of the chip forming region with a surface of the substrate being kept exposed, and a seventh step of removing the etching mask and forming an upper electrode wiring layer on the second inter-layer film, the wiring layer establishing connection to the electrode wiring.

That is, the chip cut-off line region has an edge cross section including a step caused by the dummy wiring formed in the sixth step.

Moreover, there is provided a semiconductor device manufacturing method, at least including a first step of fabricating a transistor including a source and a drain in a chip forming region of a semiconductor substrate and a gate electrode on the substrate with a gate insulation film therebetween, a second step of forming a first inter-layer film on the substrate, the film covering the transistor; a third step of fabricating a first electrode wiring on the first inter-layer film and forming a first dummy wiring on the first inter-layer film of an outer-most periphery of the chip forming region, the first dummy wiring being formed in a layer in which the first electrode wiring is fabricated; a fourth step of forming a second inter-layer film on the first electrode wiring and the first dummy wiring, a fifth step of forming a second electrode wiring on the second inter-layer film and fabricating a second dummy wiring on the second inter-layer film in parallel with the first dummy wiring, the second dummy wiring being in a layer in which the second electrode wiring is fabricated, an edge portion of the outer-most periphery of the chip forming region being over the first dummy wiring and being inside an edge portion of the first dummy wiring on a side of the outer-most periphery of the chip forming region; a sixth step of forming a third inter-layer film on the second electrode wiring and the second dummy wiring, a seventh step of forming an etching mask on the third inter-layer film, the mask being over the second dummy wiring, an edge portion of the mask on an outside of the chip forming region being inside an outer edge portion of the chip forming region of the second dummy wiring; an eighth step of etching the first to third inter-layer films using an etching mask and the first and second dummy wirings are not easily etched and thereby forming a cut-off line region in an outer periphery of the chip forming region with a surface of the substrate being kept exposed, and a ninth step of removing the etching mask and forming an upper electrode wiring layer on the third inter-layer film, the wiring layer establishing connection to the electrode wiring.

Namely, the chip cut-off line region has an edge cross section including steps of the first and second dummy wirings formed in the eighth step.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Referring now to the accompanying drawings, description will be given of an embodiment of a semiconductor manufacturing method in accordance with the present invention.

FIGS. 2A to 2I show in schematic diagrams an embodiment the semiconductor manufacturing method in accordance with the present invention. In the following description of this embodiment a DRAM will also be used as an example as in the description of the conventional technology. As can be seen from FIG. 2A, there are basically provided on a semiconductor substrate 111 a peripheral region 101, a peripheral circuit region 102, and a memory cell region 103 in which a memory cell is formed.

Figure 2A:
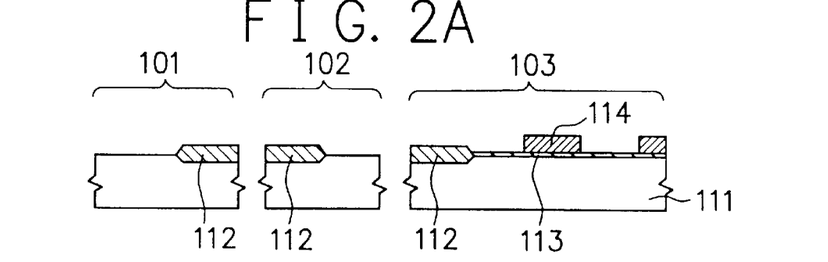
FIGS. 2A to 2I are diagrams for explaining an embodiment of a method of manufacturing a semiconductor device in accordance with the present invention.

The constituent regions of the embodiment are produced as follows. In the memory cell region 103, there is fabricated a gate electrode 114 with polycrystalline silicon or the like on a gate insulating film 113 in a domain defined by a device separating region 112 on the substrate 111. Although not shown, after the gate electrode 114 is formed, an ion injection process or the like is carried out with the electrode 114 as a mask to thereby fabricate an impurity region which is used as a source region and/or a drain region.

Figure 2B:
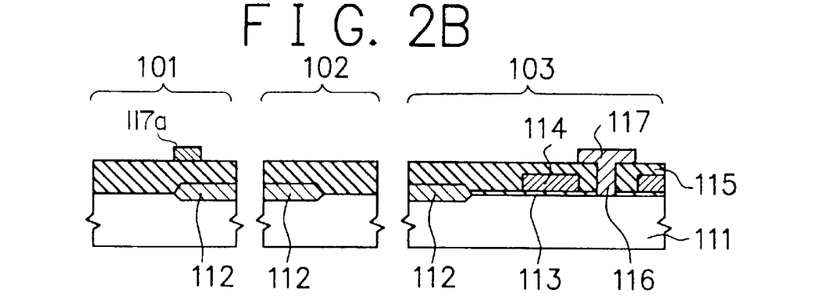

Subsequently, in the overall region of the substrate 111, an inter-layer film 115 is manufactured with an insulating material such as $SiO_2$, BPSG, or the like and then there is formed a contact region 116 of polycrystalline silicon or the like to be connected to a drain region fabricated at a predetermined position of the substrate 111 as shown in FIG. 2B. A bit line 117 is then formed with polycrystalline silicon or the like to be connected thereto. In this embodiment, a dummy wiring region 117a is simultaneously formed at a predetermined position of the peripheral region 101. The film 115 has a thickness of 300 nanometers (nm) and the wiring 117a has a thickness of 180 nm and a width of 2 $\mu$m to 5 $\mu$m.

Figure 2C:
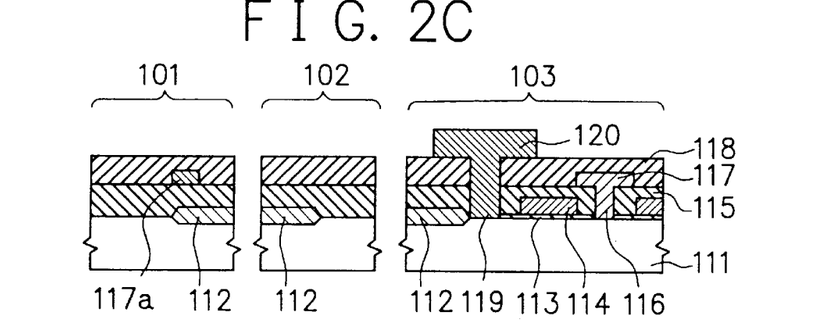

Thereafter, as can be seen from FIG. 2C, an inter-layer film 118 is formed with an insulating material on the inter-layer film 115 including the bit line 117 and the dummy wiring 117a, a contact region 119 is fabricated to be connected to a source region formed at a predetermined position of the substrate 111, and a capacitive electrode 120 is fabricated to be linked with the contact region 119. The film 118 has a thickness of 500 nm.

Figure 2D:
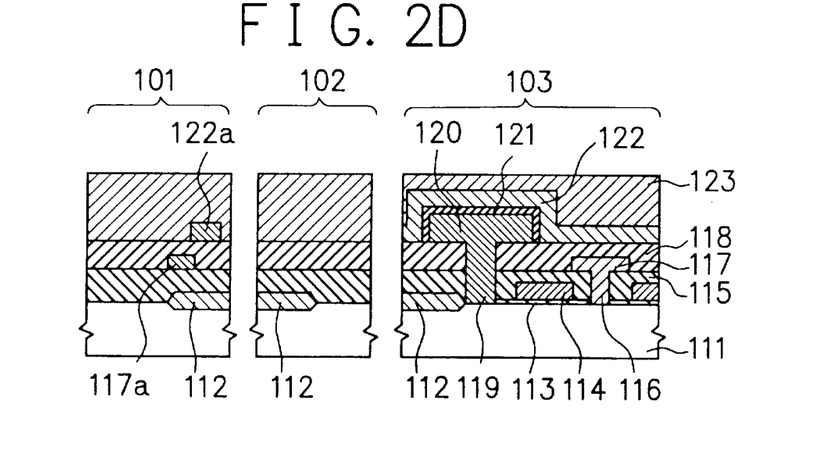

Subsequently, a capacitive insulating film 121 is manufactured to cover the electrode 120 and then a cell plate 122 is fabricated thereon with polycrystalline silicon, doped polycrystalline silicon, or the like as shown in FIG. 2D. As a result, there is produced a fundamental configuration of a memory cell including a transistor, further including the gate electrode 114 and a capacitor including the capacitive electrode 120 connected to the transistor, the capacitive insulating film 121, and the cell plate 122. In this embodiment, a dummy wiring region 122a is formed in an area inside the dummy wiring 117a of the peripheral region 101, the region 122a being in the layer of the cell plate 122. The dummy wiring has a thickness of about 180 nm and a width of about 10 $\mu$m to 20 $\mu$m.

Next, an inter-layer film 123 is fabricated with an insulating material on the film 118 including the cell plate 122 as shown in FIG. 2D. The film 123 is a laminated layer including a silicon oxide film and a silicon nitride film and has a thickness of about 2 $\mu$m. Formed on the film 123 is a wiring layer to be connected to the bit line 117 and the cell plate 122 described above.

Figure 2E:
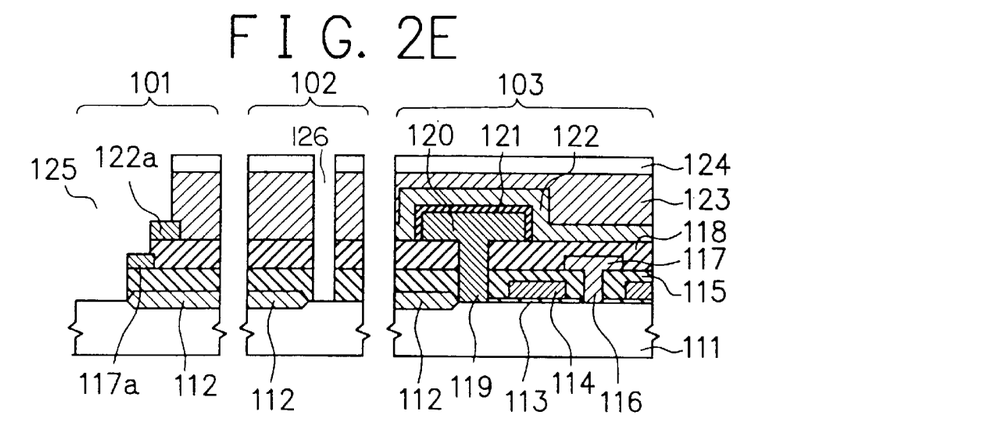

Moreover, as can be seen from FIG. 2E, a resist pattern 124 is formed by known photolithography technology. The pattern 124 includes holes for the cut-off regions in the peripheral region 101 and holes for through-hole forming regions in the peripheral circuit region 102, the through-holes being used to establish connection to the semiconductor substrate. By achieving an etching process with the resist pattern 124 as a mask, there are fabricated a cut-off region 125 and a contact hole 126. The groove of cut-off region 125 has a width of about 100 $\mu$m. Although not shown, a through-hole is also simultaneously fabricated to establish connection to the bit line 117 and the cell plate 122.

In this embodiment, an edge portion of the resist pattern 124 is inside the peripheral edge portion of the dummy wiring 122a as shown in FIG. 2E.

In the etching process using the resist pattern 124 as a mask, an insulating material is to be etched. Therefore, the dummy wiring 117a and 122a are not etched. Resultantly, in accordance with this embodiment, a step between the cut-off region 125 and the memory cell region is smoother when compared with the step of the conventional technology described in conjunction with FIG. 1E. In the embodiment, the peripheral edge of the film 123 is apart about 10 $\mu$m from the edge of the film 115.

The dummy wiring may be electrically insulated from ordinary wiring regions or may be used as a grounding region or an ordinary wiring. Additionally, after the fabrication of the contact hole, there may be conducted a wet etching process using buffered hydrogen fluoride to taper an upper portion of the contact hole so as to improve physical functionality thereof. Thanks to the isotropic etching described above, an outside circumferential portion of the film 123 can be rounded in its upper portion, which leads to a further smoothed state.

Figure 2F:
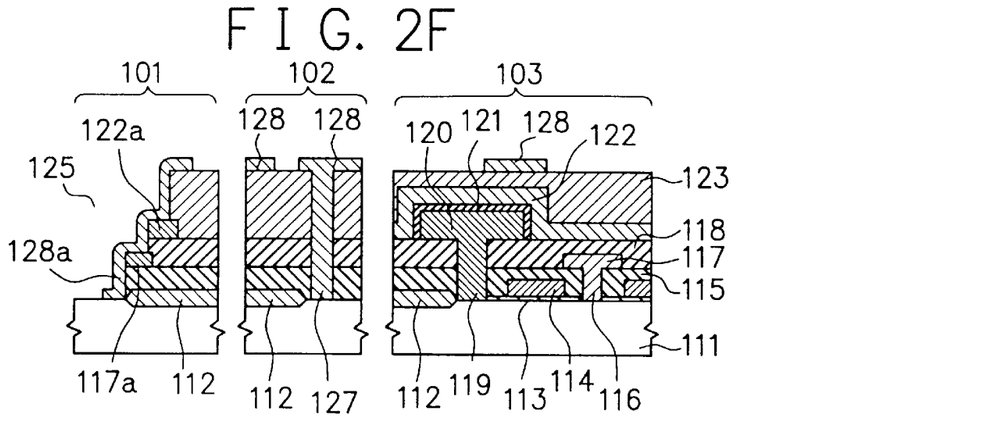
Figure 2G:
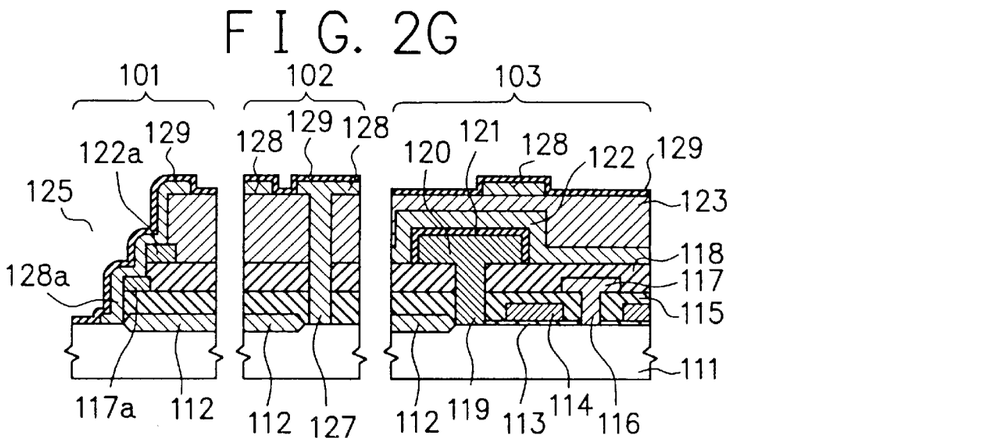

Next, a contact region 127 and a tungsten wiring 128 are fabricated in this sequence as shown in FIG. 2F. In this process, a protective film 128a is formed with tungsten to coat surfaces exposed due to the fabrication of the cut-off region 125.

Figure 2H:
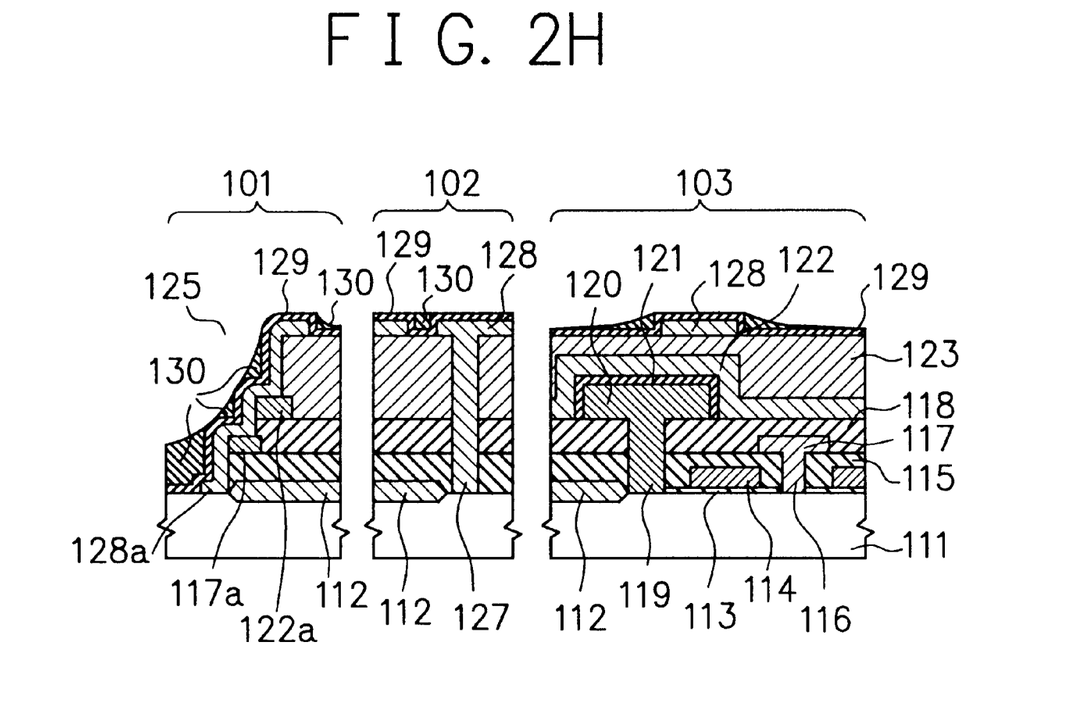

Subsequently, there is fabricated on the inter-layer film 123 including the wiring 128 an insulating film 129 with silicon nitride. Formed thereon is a coating film of an organic silica or the like. After firing the film, an etch-back process is conducted thereon to produce a smoothed insulating film 130 as shown in FIG. 2H.

In this embodiment, even when the cut-off region 125 has a large step, for example, of about 2 $\mu$m, the step is smoothed thanks to the fabrication of the dummy wirings 107a and 122a. The step is much smoother due to the manufacturing of the protective film 128a and the insulating film 129. When using organic silica, an advantageous effect can be obtained if the step of one inter-layer film (insulating layer) is equal to or less than 2 $\mu$m, preferably, equal to or less than 1 $\mu$m.

As a result, in accordance with the embodiment, in the fabrication of the smoothed insulating film 130, the nonuniform coating is prevented in the organic silica coating process. Consequently, the production of a thicker portion is prevented in the coated film.

Figure 2I:
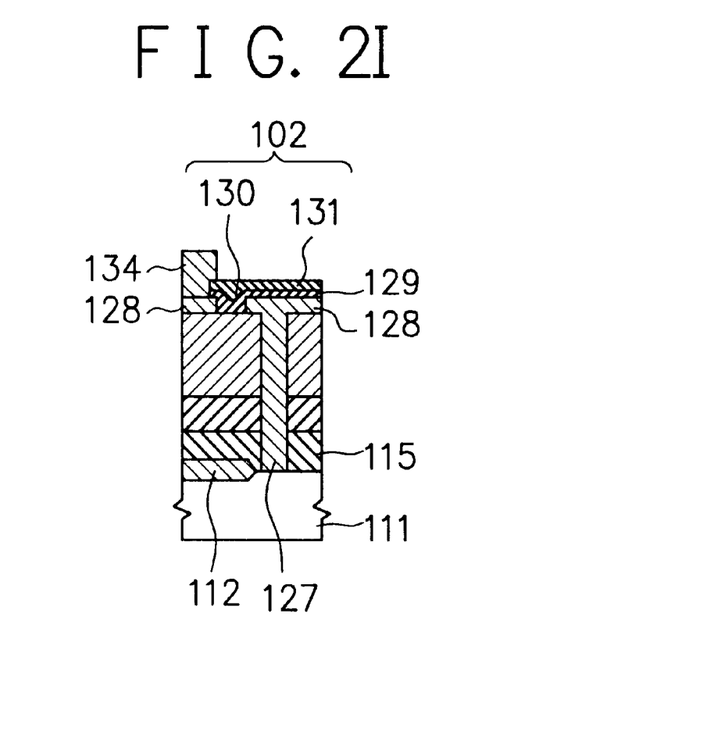

Subsequently, as can be seen from FIG. 2I, an insulating film 131 is manufactured with silicon nitride on the smoothed insulating film 130 to thereby form an inter-layer film 132 including the insulating film 129, the smoothed insulating film 130, and the insulating film 131. In FIG. 2I, the peripheral circuit region 102 is representatively shown.

In the region 102, a contact region 133 is formed to be connected to the tungsten wiring 128 and an upper electrode 134 is fabricated to be linked therewith. In this process, since the partial thick portion is prevented from being formed in the smoothed insulating film 110, it is possible to minimize the connection defect between the contact region 133 and the tungsten wiring 128.

As described above, there is provided a semiconductor device manufacturing method in accordance with the present invention.

Moreover, in accordance with the present invention as described above, there is fabricated, for example, a first inter-layer film on a semiconductor substrate to cover a transistor formed in a chip forming region of the substrate, a first electrode wiring is formed on the first inter-layer film and a first dummy wiring is fabricated on the first inter-layer film of an outer-most periphery of the chip forming region, the first dummy wiring being formed in a layer in which the first electrode wiring is fabricated; a second inter-layer film is manufactured on the first electrode wiring and the first dummy wiring, a second electrode wiring is formed on the second inter-layer film and a second dummy wiring is fabricated on the second inter-layer film in parallel with the first dummy wiring, the second dummy wiring being in a layer in which the second electrode wiring is fabricated, an edge portion of the outer-most periphery of the chip forming region being over the first dummy wiring and being inside an edge portion of the first dummy wiring on a side of the outer-most periphery of the chip forming region; a third inter-layer film is fabricated on the second electrode wiring and the second dummy wiring, an etching mask is formed on the third inter-layer film, the mask being over the second dummy wiring, an edge portion of the mask on an outside of the chip forming region being inside an outer edge portion of the chip forming region of the second dummy wiring; the first to third inter-layer films are etched using an etching mask and the first and second dummy wirings are not easily etched to thereby form a cut-off line region in an outer periphery of the chip forming region with a surface of the substrate being kept exposed, and the etching mask is removed and then an electrode wiring layer is fabricated on the third inter-layer film, the wiring layer establishing connection to the electrode wiring.

Consequently, a cross-sectional plane of an end portion of the chip cut-off line region includes steps respectively of the first and second dummy wiring regions, and hence there is obtained a smooth contour, not a steep contour. As a result, for example, when the third inter-layer film is formed through a coating process, it helps the organic silica liquid or the like to flow more easily. This prevents the silica liquid to be kept remained thereon and it is therefore possible to remove the disadvantage in which the organic silica partially flows from the step of the cut-off region. This leads to an advantageous effect in which the nonuniform coating is prevented from being formed.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor device, comprising:
   a transistor including a source and a drain formed in a chip forming region of a semiconductor substrate and a gate electrode formed on the substrate with a gate insulation film therebetween;
   a first inter-layer film formed on the substrate, the film covering the transistor;
   a lower electrode wiring layer fabricated on the first inter-layer film;
   a second inter-layer film formed on the lower electrode wiring layer;
   an upper electrode wiring layer formed on the second inter-layer film, the upper electrode wiring layer establishing connection to the lower electrode wiring layer;
   a cut-off line region formed in an outer-most boundary of the chip forming region with a surface of the substrate being kept exposed; and
   a dummy wiring formed on an edge portion of the first inter-layer film said edge portion being formed within the cut-off line region, the dummy wiring being formed in a layer in which the lower electrode wiring layer is fabricated, with an edge portion of the second inter-layer film also being formed within the cut-off line region and said dummy wiring is connected with the upper electrode wiring.

2. A semiconductor device, comprising:
   a transistor including a source and a drain formed in a chip forming region of a semiconductor substrate and a gate electrode formed on the substrate with a gate insulation film therebetween;
   a first inter-layer film formed on the substrate, the film covering the transistor;
   a first electrode wiring layer fabricated on the first inter-layer film;
   a second inter-layer film formed on the first electrode wiring layer;
   a second electrode wiring layer fabricated on the second inter-layer film;
   a third inter-layer film formed on the second electrode wiring layer;
   an upper electrode wiring layer formed on the third inter-layer film, the upper electrode wiring layer establishing connection to the first and second electrode wiring layers;

a cut-off line region formed in an outer-most boundary of the chip forming region with a surface of the substrate being kept exposed;

a first dummy wiring formed on an edge portion of the first inter-layer film said edge portion of said first inter-layer film being formed within the cut-off line region, the first dummy wiring being formed in a layer in which the first electrode wiring layer is fabricated; and a second dummy wiring formed on an edge portion of the second inter-layer film said edge portion of said second inter-layer film being formed within the cut-off line region, the second dummy wiring being formed in a layer in which the second electrode wiring layer is fabricated, with an edge portion of the third inter-layer film being formed within the cut-off line region and said first dummy wiring, said second dummy wiring, and said upper electrode wiring layer are connected.

3. The semiconductor device, of claim 1; wherein said upper electrode wiring layer is formed so that said upper electrode wiring layer:

substantially covers said cut-off line region while exposing said surface of said substrate; and establishes connections between said upper electrode wiring layer, said lower electrode wiring layer, and said dummy wiring;

said upper electrode wiring layer being substantially covered by a third inter-layer film.

4. The semiconductor device, of claim 2; wherein said upper electrode wiring layer is formed so that said upper electrode wiring layer:

substantially covers said cut-off line region while exposing said surface of said substrate; and establishes connections between said upper electrode wiring layer, said second electrode wiring layer, said first electrode wiring layer, said second dummy wiring, and said first dummy wiring;

said upper electrode wiring layer being substantially covered by a fourth inter-layer film.

* * * * *

UNITED STATES PATENT AND TRADEMARK OFFICE
CERTIFICATE OF CORRECTION

PATENT NO.    : 6,091,097
DATED         : July 18, 2000
INVENTOR(S)   : Hideomi Shintaku It is certified that error appears in the above-identified patent and that said Letters Patent is hereby corrected as shown below:

Column 2,
Line 41, delete "(282)" insert -- $2\mu$ --.

Signed and Sealed this

Twenty-fifth Day of September, 2001

Attest:

*Nicholas P. Godici*

NICHOLAS P. GODICI
*Attesting Officer*    *Acting Director of the United States Patent and Trademark Office*